United States Patent [19]
Chiu

[11] Patent Number: 4,561,002
[45] Date of Patent: Dec. 24, 1985

[54] CAPACITIVE TOUCH SWITCH ARRANGEMENT

[75] Inventor: Norman H. Chiu, Louisville, Ky.

[73] Assignee: General Electric Company, Louisville, Ky.

[21] Appl. No.: 412,737

[22] Filed: Aug. 30, 1982

[51] Int. Cl.[4] ................................................ G08C 9/00
[52] U.S. Cl. ............................... 340/365 C; 200/5 A; 200/DIG. 1; 340/365 R
[58] Field of Search .......... 340/365 C, 365 E, 365 R, 340/365 S, 365 A; 400/479.1; 200/DIG. 1, 5 A; 179/90 K; 219/10.77

[56] References Cited

U.S. PATENT DOCUMENTS

| | | | |
|---|---|---|---|
| 3,482,241 | 12/1969 | Johnson | 340/365 C |
| 3,653,038 | 3/1972 | Webb | 340/365 C |
| 3,668,417 | 6/1972 | Sessler | 340/365 C |
| 3,691,555 | 9/1972 | Looschen | 340/365 |
| 3,750,149 | 7/1973 | Sessler | 340/365 C |
| 3,786,495 | 1/1974 | Spence | 340/365 C |
| 3,846,791 | 11/1974 | Foster | 340/365 C |
| 3,971,013 | 7/1976 | Challoner et al. | 340/337 |
| 4,027,306 | 5/1977 | Hackmeister | 340/365 C |
| 4,053,789 | 10/1977 | Schultz | 307/116 |
| 4,125,783 | 11/1978 | Sefton | 307/116 |
| 4,136,291 | 1/1979 | Waldron | 307/308 |
| 4,145,748 | 3/1979 | Eichelberger et al. | 364/862 |
| 4,157,539 | 6/1979 | Hunts et al. | 340/365 C |
| 4,221,975 | 9/1980 | Ledniczki | 340/365 C |
| 4,233,522 | 11/1980 | Grummer et al. | 307/116 |
| 4,237,421 | 12/1980 | Waldron | 340/365 C |
| 4,288,786 | 9/1981 | Ledniczki | 340/365 C |
| 4,290,061 | 9/1981 | Serrano | 340/712 |
| 4,394,643 | 7/1983 | Williams | 340/365 C |
| 4,398,181 | 8/1983 | Yamamoto | 340/365 C |
| 4,413,252 | 11/1983 | Tyler | 340/365 C |
| 4,415,781 | 11/1983 | Frame | 340/365 C |
| 4,441,097 | 4/1984 | Anderson | 340/365 A |
| 4,446,350 | 5/1984 | Mizukawa | 340/365 E |

Primary Examiner—John W. Caldwell, Sr.
Assistant Examiner—Michael F. Heim
Attorney, Agent, or Firm—H. Neil Houser; Radford M. Reams

[57] ABSTRACT

A capacitive attenuator type touch switch cell arrangement employs a touch responsive pad or electrode and a receiver electrode of comparable surface area on opposing surfaces of a dielectric substrate for capacitive coupling therebetween, which capacitive coupling is alterable by the human touching of or proximate to the touch pad. A scan signal is coupled from signal generating circuitry to the touch responsive pad by a separate transmitting capacitor. Signal detection circuitry senses the signal coupled to the receiver electrode to detect attenuation of the coupled signal signifying the touching of the touch pad. The use of a separate capacitor to provide the transmitting capacitance reduces the touch pad area requirement, thereby permitting closer spacing of touch switch cells for greater switch density on a control panel.

10 Claims, 15 Drawing Figures

CAPACITIVE TOUCH SWITCH ARRANGEMENT

BACKGROUND OF THE INVENTION

The present invention relates to capacitive touch switch arrangements and more particularly to a novel touch switch arrangement employing only one electrode on the opposing surface of a dielectric substrate opposite each touch electrode to accommodate a greater number of touch electrodes in a given surface area.

Capacitive touch control panels are a well known means for providing user control inputs to various devices, including major home appliances such as cooking ranges and microwave ovens, which have capacitive touch switches arranged in a keyboard array. With such touch panels, the user merely touches a touch area on the panel to initiate a switching action rather than moving a mechanical switch.

Capacitive touch systems can generally be classified in two types. In one, the switch cells each comprise a single capacitor formed of two conductive plates located on a single surface of a dielectric material. The capacitor is energized from a pulsating signal source and is coupled to a signal detection circuit, the detected signal being a function of the capacitance which is changed in response to touch. The switch cell of the other type of capacitive touch system each comprises one pair of series connected capacitors formed of three conductive plates, two closely spaced on one surface of a dielectric material and the third plate on the opposing surface overlapping the other two plates. In this device, the series connected capacitors, which are energized by an AC signal source, form a voltage divider arrangement with the stray capacitance at the input to the signal detector. Touching the third plate alters the capacitive voltage divider arrangement, thereby changing the voltage level at the detection circuit as a function of touch.

This latter type of system is capable of good signal characteristics and an effective and reliable operation when sufficient signal is capacitively coupled through the series capacitor pair of each device. Satisfactory operation generally requires some minimum value of capacitance for the series capacitors, as well as relatively small parasitic capacitive effects. Since, for a given dielectric material, the series capacitance is proportional to the capacitor plate area, presently known switch devices of the capacitance attenuator type for practical appliance control applications have minimum area requirements that tend to preclude their application to switch arrays needing a relatively large number of switch cells within the constraint of a relatively small panel surface area.

A touch panel arrangement which provides the performance capability and employs the well developed interfacing circuitry of the three-plate type of capacitive touch system but which is applicable to switch array applications requiring a relatively large number of switch cells in a relatively small panel area would be highly desirable.

OBJECTS OF THE INVENTION

It is accordingly an object of the invention to provide a novel and improved capacitive touch switch arrangement useful as a control panel for various devices requiring control inputs from human users such as major home appliances, wherein switch cells can be relatively closely spaced.

A further object of the invention is to provide a novel and improved capacitive touch switch arrangement as above described which retains the good signal transfer characteristics and reliable operation of the three plate device but wherein the touch cells have relatively small area touch electrodes that can be relatively closely spaced.

A further object of the invention is to provide a novel and improved capacitive touch switch arrangement as above described which is compatible with interface circuitry used with the three-plate device.

SUMMARY OF THE INVENTION

The novel and improved capacitive attenuator type touch switch cell arrangement in accordance with one aspect of the present invention employs a touch responsive pad or electrode and a receiver electrode of comparable surface area on opposing surfaces of a dielectric substrate for capacitive coupling therebetween, which capacitive coupling is alterable by the human touching of or proximate to the touch pad. A scan signal is coupled from signal generating circuitry to the touch responsive pad by a separate transmitting capacitor. Signal detection circuitry senses the signal coupled to the receiver electrode to detect attenuation of the coupled signal signifying the touching of the touch pad. The use of a separate capacitor to provide the transmitting capacitance reduces the touch pad area requirement, thereby permitting closer spacing of touch switch cells for greater switch density on a control panel.

In accordance with a further aspect of the invention, a touch control panel comprising an array of touch switch cells of the above-described type is provided with a first plurality of conductive paths, each connecting a transmitting capacitor to its associated touch pad fabricated on the outwardly facing surface of the substrate. A second plurality of conductive paths is fabricated, each extending relatively closely adjacent at least one of said first conductive paths such that the human touching of one of the first conductive paths ordinarily results in the touching of at least one of the second conductive paths. The second conductive paths are commonly connected to the junction of a pair of serially connected capacitors whereby the second paths act as a "psuedo" touch pad. A test signal is applied to the serially connected capacitors in concert with the application of each scan signal to the touch pads. The touching of one or more of the second paths attenuates the test signal. The signal detection circuitry senses the coupled scan signal and the coupled test signal. Detection of attenuation of the test signal overrides the detection of attenuation of the scan signal to prevent an erroneous control input which might otherwise result from the inadvertent touching of the touch panel in the vicinity of the first conductive paths.

In accordance with yet another aspect of the invention, the above-described touch switch cell arrangement further includes an outer dielectric panel which overlays the dielectric substrate carrying the touch and receiver electrodes. Touch zones are depicted on the outer panel in register with the underlying touch pads. Such an arrangement permits the use of a thinner dielectric substrate and less expensive circuit fabrication techniques, in addition to greater flexibility in designing the appearance of the control panel.

BRIEF DESCRIPTION OF THE DRAWINGS

While the specification concludes with claims which particularly point out and distinctly claim that subject matter which is regarded as the invention, it is believed that the invention will be better understood and appreciated when considering the following detailed description taken in conjunction with the accompanying drawings in which:

DETAILED DESCRIPTION OF THE INVENTION

Figure 1:
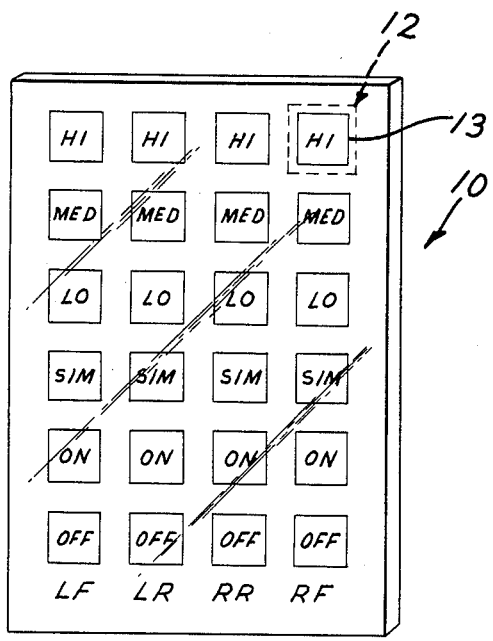
FIG. 1 is a perspective view of a capacitive touch control panel for a kitchen appliance.

In FIG. 1, there is illustrated a capacitive touch panel 10 for controlling the four surface units of an electric cooking range. In the example to follow, a capacitive touch panel of the type illustrated generally in FIG. 1, is connected to a microprocessor that controls the operation of a kitchen range appliance. It is to be understood, however, that the illustrative capacitive touch panel has application to many other appliances and equipment subject to user control.

Capacitive touch panel 10 comprises an array of touch sensitive switch cells 12 responsive to the human touch which in accordance with the invention include relatively small area touch pads 13 which can be located on closely spaced centers providing the relatively high number of switches in a relatively small panel area. In the illustrative example the touch pads enable the appliance user to select one or more surface heating elements and a power setting for each element.

For ease of illustration, the switch array is shown as a 4×6 matrix of six rows and four columns of touch sensitive switch cells 12 to provide ON, OFF and four power level settings for each of four heating elements. It will be readily apparent that the switch array could be made larger or smaller as desired, depending upon the desired number of control inputs.

The description to this point, except for the relatively small closely spaced touch pads, is generally applicable to capacitive touch panel arrays well known in the art. The switch cell arrangement commonly used in such prior art arrays is of the type referred to as a capacitive attenuator switch type in which the body capacitance of the user, which is added to the switch circuit when a touch pad is touched, attenuates a scan signal, signifying to the associated control circuitry that the pad has been touched.

Figure 2A:
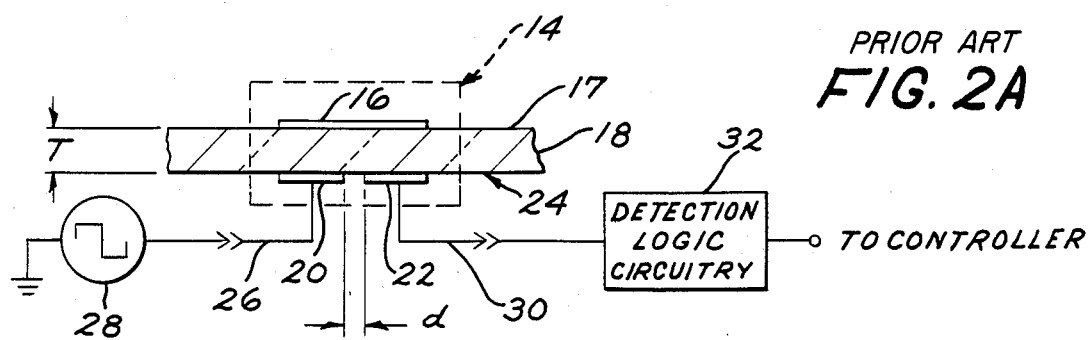
FIG. 2A is a sectional view of a capacitive attenuator type switch cell known in the prior art.

Referring to FIG. 2A, a prior art capacitive attenuator type switch cell arrangement is illustrated. The prior art switch cell designated 14 comprises a touch electrode 16 of conductive or semi-conductive material which is fabricated on the front or outwardly facing surface 17 of a dielectric substrate 18. A pair of electrodes or pads 20 and 22, commonly referred to as a transmitting electrode and a receiving electrode, respectively, are fabricated of a conductive or semi-conductive material upon the remaining inwardly facing surface 24 of substrate 18. Both transmitting and receiving electrodes are typically of substantially smaller area than and are positioned substantially within the boundaries of the area of touch pad 16. The closest points between transmitting and receiving electrodes 20 and 22 are separated by a preselected distance d, while each of electrodes 20 and 22 are separated from touch pad 16 by a preselected dielectric thickness T derived in accordance with the insulating and structural characteristics to be achieved. Transmitting electrode 20 has an associated conductor 26 coupled to a point thereon for connection of electrode 20 to a signal generator 28 configured to drive transmitting electrode 20 with a pulsating waveform. Receiver electrode 22 has an associated conductor 30 coupled to a point thereon for connection of electrode 22 to signal detection circuitry 32, which circuitry senses the signal coupled from electrode 20 to electrode 22 and detects the decrease in the magnitude of the signal resulting from the body capacitance of the user being introduced into the circuit by a touch of touch pad 16.

Figure 2B:
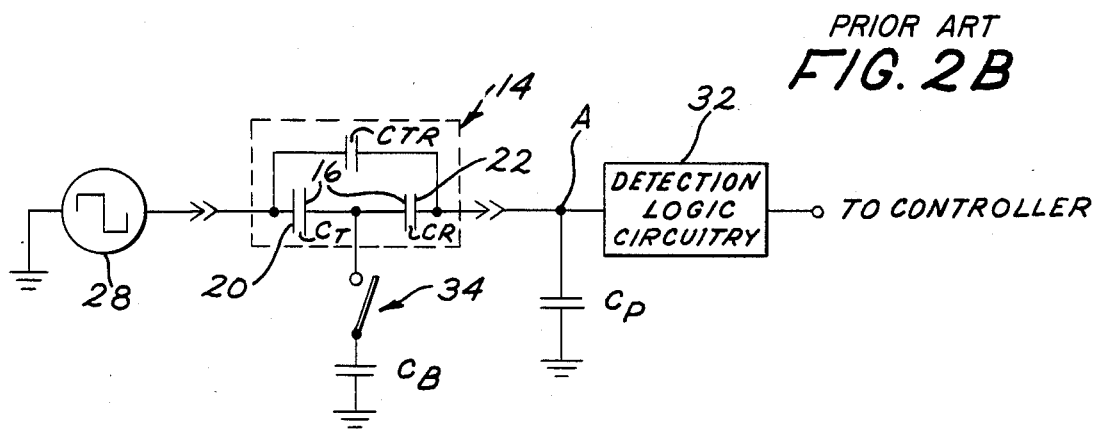
FIG. 2B is a schematic circuit diagram representing the equivalent circuit for the touch switch cell of FIG. 2A.

FIG. 2B illustrates the equivalent electrical circuit for switch cell arrangement of FIG. 2A. In this circuit, capacitance $C_T$ represents the capacitance between electrode 20 and touch pad 16; capacitance $C_R$ represents the capacitance between touch pad 16 and electrode 22; and capacitance $C_{TR}$ represents the cross coupled capacitance between electrode 20 and electrode 22. The human touching of pad 16 is represented schematically as the closing of switch 34, with $C_B$ representing the body capacitance of the user which is switched into the circuit by touching to act as a shunt to ground which is effective to attentuate the signal at Point A. $C_P$ represents stray parasitic capacitance.

In order to insure proper switch operation, the capacitance of the series capacitors $C_T$ and $C_R$ formed by electrodes 20 and 22, respectively, in cooperation with touch pad 16, must be sufficient to reliably couple the pulsating signal from signal generator 28 to the detection circuitry 32. The larger the coupling capacitance, the greater the current flow which in turn reduces the susceptibility to noise.

The capacitance of the capacitors $C_T$ and $C_R$ may be determined in accordance with the well known formula:

$$C = \frac{.225\, K \times A}{T}$$

when
- C = capacitance (picofarads)
- K = dielectric constant of substrate
- A = common capacitor plate area (sq. in.)
- T = substrate thickness (in.)

The total coupling capacitance should be on the order of 2–5 picofarads (pF). This means $C_T$ and $C_R$ should each be on the order of 4–10 pF. As an example for coupling capacitance on the order of 3.5 pF, $C_T$ and $C_R$ would each be on the order of 7 pF. For a typical glass substrate having a thickness of $\frac{1}{8}$ inch, and a dielectric constant of 8, the minimum area for each of electrodes 20 and 22 would be on the order of 0.5 in$^2$. In order to minimize the cross coupled capcitance $C_{TR}$, a minimum spacing between electrodes 20 and 22 on the order of $\frac{1}{8}$ inch is recommended. Since touch pad 16 must substantially cover both electrodes, a touch pad area in excess of 1 square inch would be required for each touch pad.

Figure 3A:
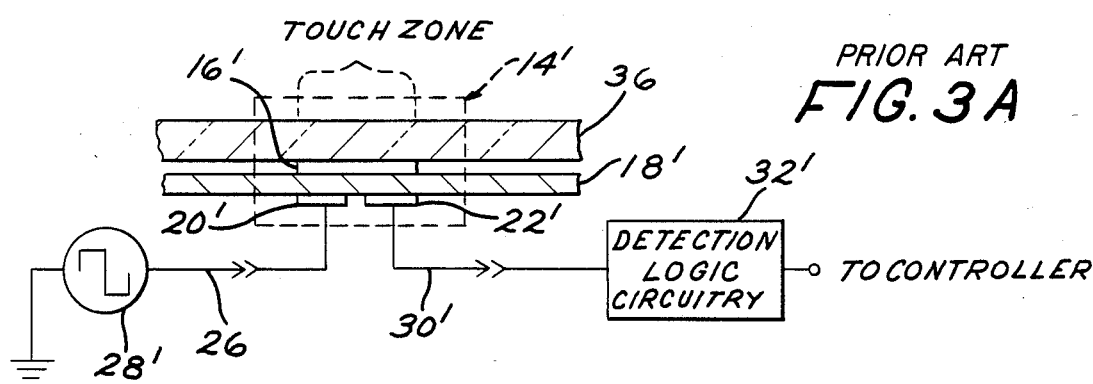
FIG. 3A is a sectional view of another capacitive attenuator type touch switch cell known in the prior art.

An alternative touch switch cell arrangement in the prior art which may increase the capacitance somewhat for a given pad area is shown in FIG. 3A, designated 14'. In this arrangement an additional dielectric outer panel 36 overlies the substrate carrying the touch pad and electrodes. Because of the additional rigidity of outer panel 36, the dielectric substrate 18' carrying the touch pad 16' and electrodes 20' and 22' may be of reduced thickness which in accordance with the above-described formula provides increased capacitance for the same plate areas. Those elements of FIGS. 3A and 3B carrying the (') designator function in the same manner as their counterparts in FIGS. 2A and 2B having the same numerical designators. Touch pad 16' and the transmitter and receiver electrodes 20' and 22', respectively, are driven by signal generator 28' and the coupled signal is sensed by detection circuitry 32'. The major difference functionally is illustrated in the equivalent circuit schematically represented in FIG. 3B, where outer panel 36 provides an additional capacitance $C_G$ in series with the body capacitance $C_B$ of the user in the short path to ground when pad 16' is touched, as represented in FIG. 2B by the closure of switch 34'.

While the reduced thickness for substrate 18' enabled by the additional structural rigidity provided by outer panel 36, provides greater capacitance for the same pad and electrode areas, the additional capacitance effect of the glass outer panel 36 reduces the attenuative effect of the touch on the coupling capacitance, thereby requiring greater capacitance for capacitances $C_T$ and $C_R$ than that for the touch cell of the FIG. 2A type in order for the detection circuitry to operate effectively at the same sensitivity level.

When a large number of touch pads are desired in a relatively small panel area, it is apparent that the minimum electrode and touch pad areas required to provide the minimum capacitance presents a significant design limitation for conventional capacitive attenuator type switch cells of either of the aforementioned type.

Since in either arrangement, both receiver and transmitter electrodes must share the touch pad, the touch pad area required to provide the minimum capacitance for each of the series capacitances $C_T$ and $C_R$ must be more than twice that required for the transmitting or receiving electrode alone.

The capacitive touch switch cell arrangement contemplated in the present invention allows the touch pad size to be reduced by more than 50 percent without sacrificing coupling capacitance and also eliminates any problems presented by the cross-coupling capacitance between transmitter and receiver electrodes. This improvement is achieved by removing the transmitter electrode from the substrate and replacing it with a discrete capacitor separate from the touch pad and the receiver electrode. By this arrangement, the required touch pad area can be reduced to the area of the receiver electrode alone without reducing the capacitance of the resulting receiver capacitance. An additional advantage of the discrete transmitter capacitor is the resultant flexibility to choose any capacitance value during the keyboard tuning and trimming process.

Figure 4A:
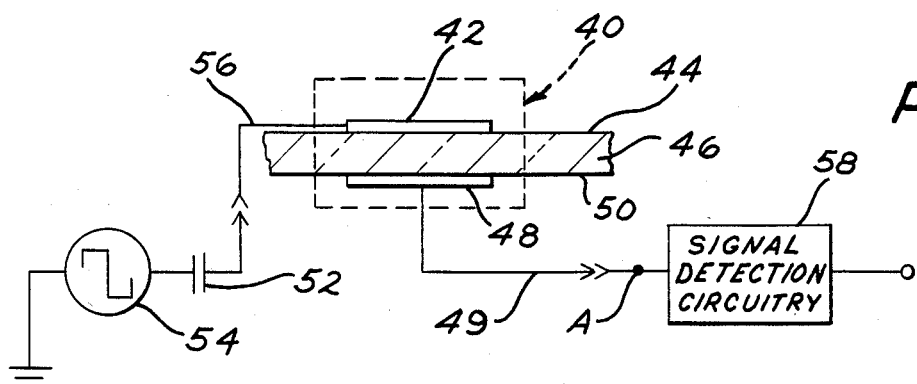
FIG. 4A is a sectional view of a capacitive touch switch cell illustratively embodying the touch switch arrangement of the invention.
Figure 4B:
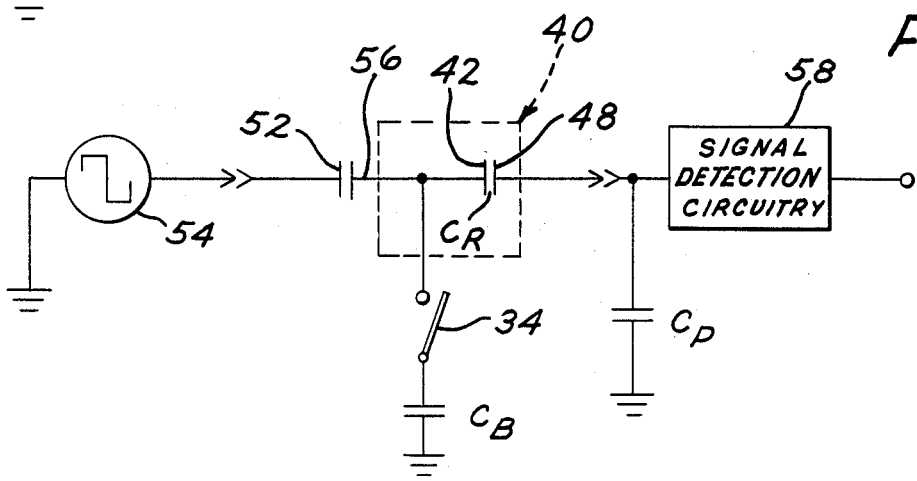
FIG. 4B is a schematic circuit diagram representing the equivalent circuit for the touch switch cell of FIG. 4A.

Referring now to FIGS. 4A and 4B, an illustrative embodiment of a touch switch cell 40 in accordance with the invention comprises a conductive touch pad 42 fabricated on the outward facing surface 44 of dielectric substrate 46, and a conductive receiver electrode 48 formed on the opposite surface 50 of substrate 46 in an area overlying and bounded by the area of touch pad 42 to enable the capacitive coupling of a signal from pad 42 to receiver electrode 48. A discrete capacitor 52 capacitively couples the pulsating signal from signal generator 54 to pad 42 via conductor 56 a substantial portion of which is formed on surface 44 of substrate 46. Receiving electrode 48 has an associated conductor 49 coupled to a point thereon for connection of electrode 48 to detection circuitry 58. Detection circuitry 58 senses the signal at point A as in FIG. 2A to detect the change in the signal at A resulting from the human touching of pad 42.

The equivalent circuit for the touch switch cell arrangement of the present invention is illustrated in FIG. 4B. In this circuit receiver capacitor $C_R$ is formed by touch pad 42 and receiver electrode 48. However, the function of the transmitter capacitor ($C_T$ in FIG. 2B) is performed in this arrangement by discrete capacitor 52. As in FIG. 2B, the introduction of user body capacitance by touching of touch pad 42 is represented by switch 34 and capacitor $C_B$.

Since only the receiver capacitor $C_R$ uses pad 42 as a plate thereof, pad 42 need only be large enough to cover electrode 48. For the same glass substrate and minimum capacitance requirements described with reference to FIG. 2A, touch pad 42 need be only on the order of 0.5 square inch rather than the 1.0 square inch of the conventional arrangement.

Figure 5A:
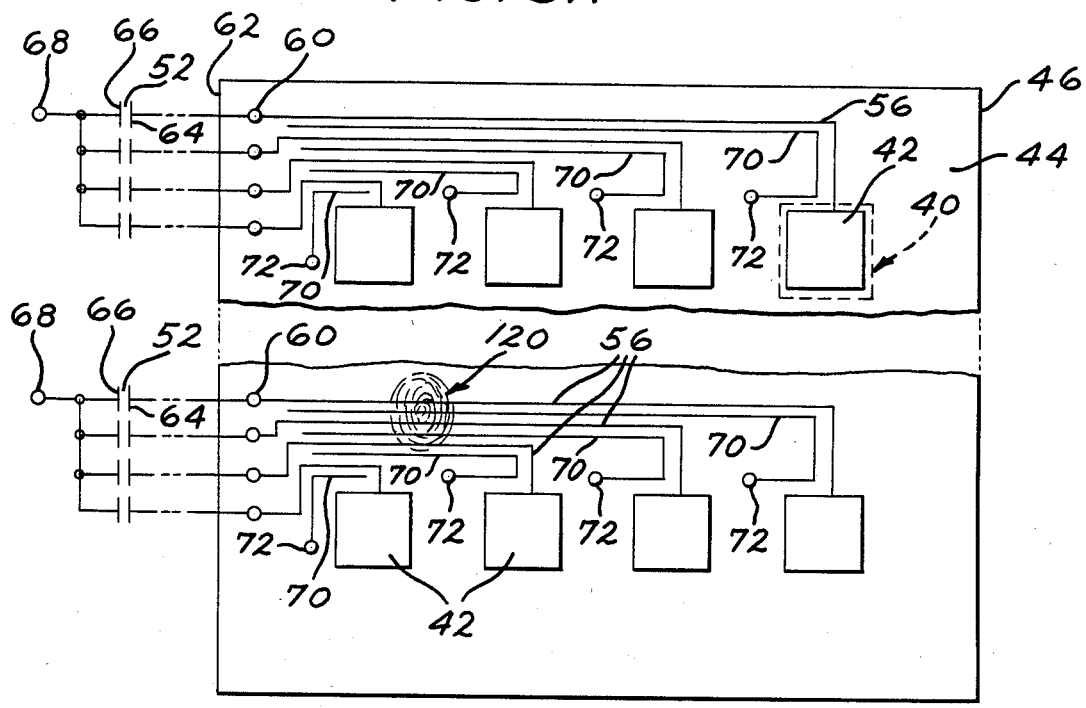
FIG. 5A is a plan view of the touch electrodes and associated circuitry carried on the front side of a dielectric substrate for a touch control panel of the type illustrated in FIG. 1, in accordance with one embodiment of the invention including a schematic diagram of the array of transmitting capacitors connected to the substrate circuitry.
Figure 5B:
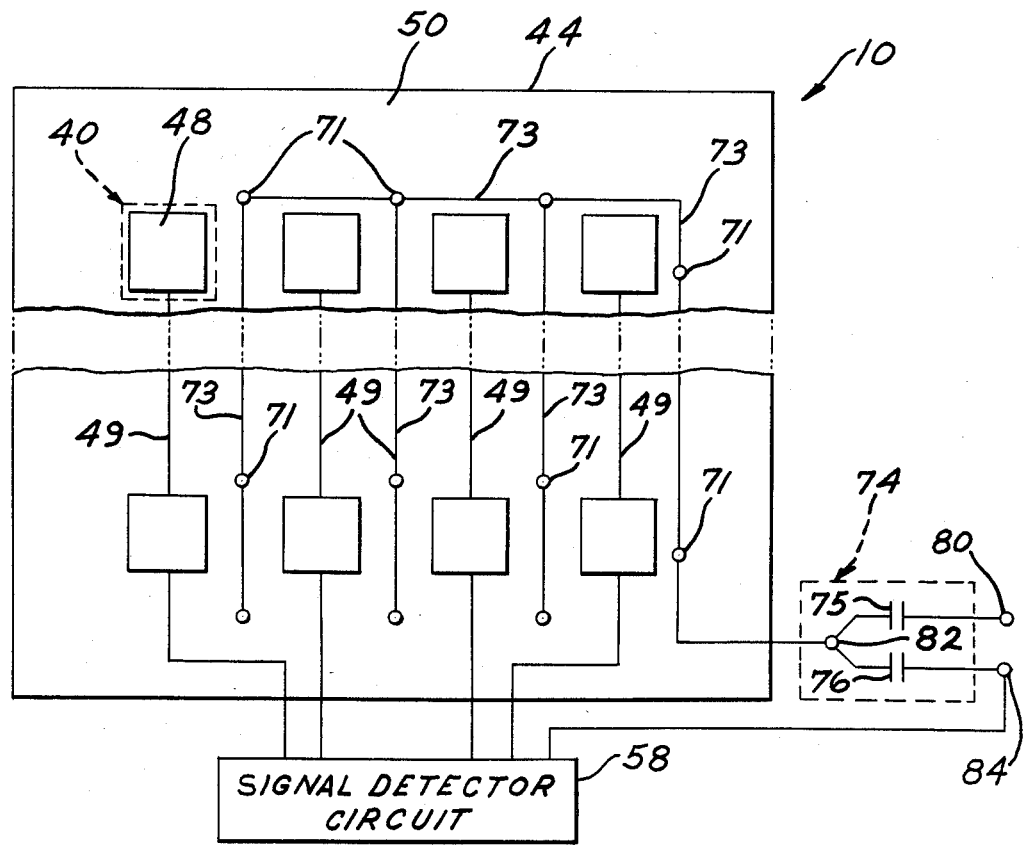
FIG. 5B is a plan view of the receiver electrodes and associated circuitry carried on the rear side of the substrate of FIG. 5A.

Having described an illustrative embodiment of an individual touch switch cell, reference is now made to FIGS. 5A and 5B to describe an array of such cells 40 such as might be used for a touch panel 10 of FIG. 1.

FIG. 5A schematically illustrates the outer face 44 of a dielectric substrate 46 for a touch panel on which a 4×6 array of conductive touch pads 42 are fabricated in a layout similar to that of the touch panel of FIG. 1. For clarity and simplicity, only two rows of the array are shown in FIGS. 5A and 5B. It is to be understood that each of the omitted rows is structurally identical to those shown. Each touch pad 42 has associated with it a conductive path or run 56 which is formed on surface 44 extending substantially parallel to the horizontal rows of touch pads to an associated terminal point 60 near edge 62 of substrate 46. A plurality of separate discrete transmitter capacitors 52 are provided with one capacitor 52 associated with each touch pad. Capacitors 52 can be combined into an electrical circuit that can be located off of substrate 46, with a flex circuit connection comprising silver conductor runs fabricated on a substrate of Mylar ® material coupling one plate 64 of each capacitor 52 to terminal point 60 for its associated touch pad. The four capacitors 52 for each row of pads 42 each have their other plate 66 commonly connected to simultaneously receive the scan signal for their row from the external scan signal generating circuitry at input terminal 68.

The opposite surface 50 of substrate 44 is schematically illustrated in FIG. 5B. Surface 50 has fabricated thereon a 4×6 array of receiver electrodes or pads 48, one for each of the touch pads 42. Each of receiver electrodes 48 are positioned in the area overlying and bounded by the area of its associated touch pad 42 to form a 4×6 array of touch switch cells 40 of the type illustrated in FIG. 4A. The receiver electrodes 48 in each column are serially connected by a conductive path 49 with each column of receiver electrodes being coupled to the signal detection circuitry 58.

Referring again to FIG. 5A, since conductors 56 are formed on the outward surface 44 of substrate 46 along with touch pads 42, it is possible for a user to inadvertently touch one or more of these conductive paths. The direct touching of one of conductors 56 would have an attenuating effect similar to the touching of the pad associated with the touched conductor. Thus, the touching of a region of substrate surface 44 carrying conductors 56 would appear to detecting circuitry 58 as the touching of the pad associated with the touched conductor.

In order to prevent the control system from responding to the resulting erroneous signal, a second plurality of conductive paths or runs 70 are formed on surface 44 of substrate 46 such that each of the first conductive paths 56 has at least one of these second paths 70 closely adjacent to it. The spacing between adjacent sections of paths 56 and 70 is selected such that the human touching of one path would also ordinarily result in the touching of the other path as well. Each of the paths 70 is connected at one end to a terminal point 72 which is electrically connected through substrate 46 to terminal points 71 formed on opposite surface 50 of substrate 46.

A capacitor network 74, comprising a pair of serially connected discrete capacitors 75 and 76, which may be mounted on surface 50 of substrate 44 or separately from substrate 44, is coupled to conductive paths 70 by conductive runs 73 formed on surface 50 joining terminal points 71. All conductive paths 70 are commonly connected via paths 73 to the junction 82 of serially connected capacitors 75 and 76. This arrangement enables conductors 70 to function as a "psuedo touch pad." Capacitive network 74 is serially connected between the signal generator circuitry 90 (FIG. 6A) and the signal detector circuitry 58. A scan or test pulse from the signal generator circuitry is applied to input 80 of network 74 simultaneously with each scan pulse applied to one of the touch pad rows. The touching of any portion of conductive path 70 results in the attenuation of the signal coupled by capacitive network 74 to point 84 just as the touching of a touch pad attentuates the signal coupled to the associated receiver electrode for that touch pad.

As will be described in greater detail hereinafter, the logic circuitry of detection circuitry 58 is arranged such that detection of an attenuated signal at output terminal 84 of capacitor network 74 takes priority over any other input to the detection circuitry. The output of any other signal to the control system signifying the touching of a touch pad is thus prevented. Since the relative positioning of conductive runs 56 and 70 is such that touching of one of runs 56 would ordinarily be accompanied by the touching of runs 70 as well, the control system does not respond to the inadvertent touching of any portion of the panel except the touch pads.

In the illustrative embodiment of FIGS. 5A and 5B, the dielectric substrate 46 is a glass panel having a ⅛" nominal thickness. A greater or lesser thickness could of course be used with the understanding that coupling capacitance between pad 42 and electrode 48 is inversely proportional to thickness. Also, a thinner glass panel may not provide the desired structural rigidity. Top pads 42 and conductive paths 56 and 70 formed on surface 44 may be formed by depositing tin oxide on the glass in the desired pattern. The glass plate would then be baked at high temperature to passivate the tin oxide into the glass. The resultant passivated tin oxide pattern is resistant to cleaning and scouring of the panel. Receiver electrodes 48 and conductors 49 and 73 formed on inner surface 50 may be inexpensively formed with silver epoxy. To minimize stray capacitance effects, the width of conductive paths 49, 56, 70, and 73 should be held to a minimum.

Figure 6A:
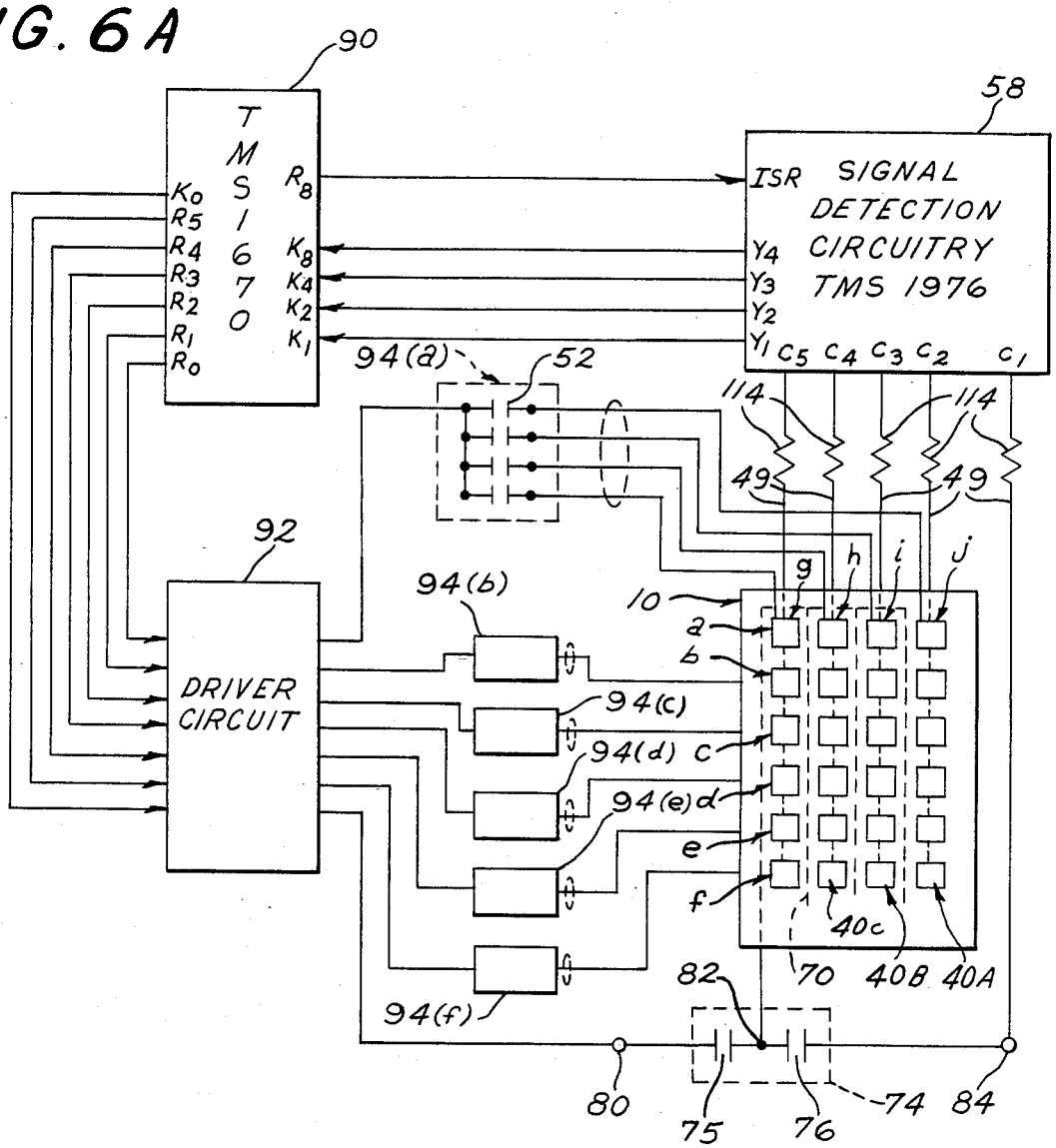
FIG. 6A is a simplified schematic circuit diagram illustrating the incorporation of a touch switch arrangement embodying the present invention in a control system for an appliance.

Illustrative control circuitry for incorporating the touch panel of FIGS. 5A and 5B into a control system for an appliance such as an electric cooking range is illustrated schematically in FIG. 6A.

In the illustrative control circuit of FIG. 6A, microprocessor 90 sequentially generates a scan pulse at each of outputs $R_0$–$R_5$, which outputs are coupled to rows a–f of the capacitive touch cell array 10 of FIGS. 5A and 5B via driver circuitry 92 and capacitor banks 94(a)–94(f), respectively. A test signal is generated at $K_0$ simultaneously with each scan pulse which is coupled by driver circuit 92 to capacitive network 74, to provide the hereinbefore described prevention of erroneous signals from touching conductive paths on the control panel rather than the touch pads.

Columns g–j of the touch cell array are coupled to inputs $C_5$–$C_2$, respectively, of detection circuitry 58 via limiting resistors 114. The output of capacitive network 74 is similarly coupled to input $C_1$ of detection circuitry 58. A BCD coded output signal from circuitry 58 is coupled to inputs $K_1$, $K_2$, $K_4$ and $K_8$ of microprocessor 90.

Circuitry 58 senses the scan signal coupled by each of the touch cells in the row being scanned to their respective column output lines 49 to detect an attenuation of the column output line signal, signifying that a touch pad in a particular column has been touched. If a touch pad in the row being scanned is touched, the signal detector circuit will detect the attenuation of the scanned signal for that column containing the touched pad. The BCD coded output signal coupled to microprocessor 90 indicates which column, if any, contains a touched pad. In this fashion, a touched pad is identified by row and column.

In the illustrative embodiment, microprocessor 90 is a TMS 1670 microprocessor commercially available from Texas Instruments Incorporated, which can be customized by permanently configuring its read only memory (ROM) to implement the desired appliance control scheme. A portion of the ROM of microprocessor 90 is configured in a conventional manner to generate the capacitive touch keyboard drive signals and to receive keyboard output signals from conventional detection circuitry. The keyboard drive signals in this arrangement are scan pulses provided sequentially at outputs $R_0-R_5$ of microprocessor 90. A test pulse is generated at output $K_0$ of microprocessor 90 simultaneously with each scan pulse. These pulses are coupled to conventional keyboard driver circuitry 92 which inverts and amplifies the outputs from $R_0-R_5$ to shape well defined negative going 30 volt scan pulses. Driver circuitry 92 also serves as a buffer to isolate the keyboard from the electronic circuitry.

Figure 6B:
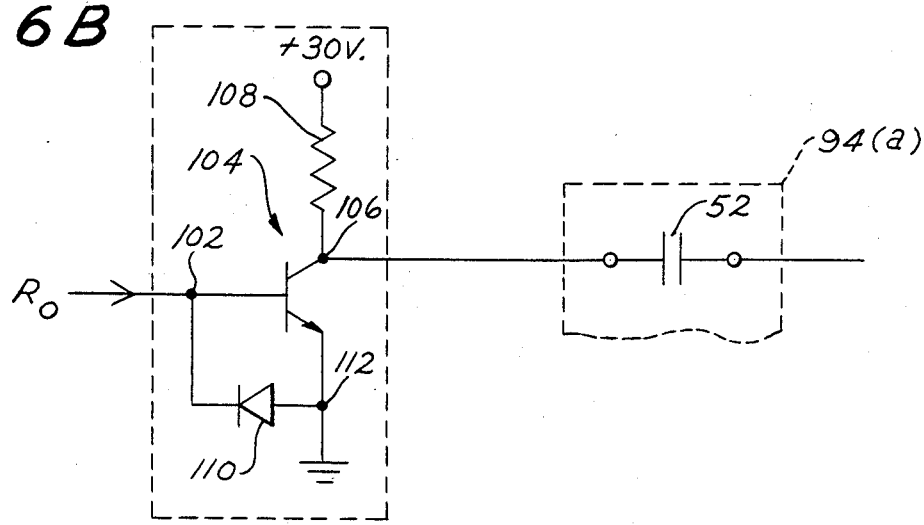
FIG. 6B is a schematic circuit diagram illustrating certain details of a portion of the circuit diagram of FIG. 6A.

A representative portion of typical driver circuitry is shown in FIG. 6B for coupling output $R_0$ to the touch panel. Output $R_0$ from microprocessor 90 is coupled to the base 102 of driving transistor 104. The collector 106 of the transistor 104 is coupled to a +30 volt d.c. supply voltage via collector resistor 108. Diode 110 couples emitter 112 and base 102 of transistor 104. The output signal is taken from collector 106 which is coupled to the corresponding transmitting capacitor 52 of network 94(a).

Each of networks 94(a)–94(f) comprises a set of four identical transmitting capacitors 52, one for each switch cell 40 in the row associated with that network. The capacitance of each of capacitors 52 is preferably in the 5–10 pF range. By this arrangement, the scan signal for each row of the touch panel is simultaneously coupled to each touch pad in that row.

In this embodiment detection circuitry 58 comprises a TMS 1976 series integrated circuit or chip which is commercially available from Texas Instruments Incorporated, which chip is designed for interfacing between a capacitive touch pad array and a microprocessor. As the details of this circuit are not critical to the claimed invention, its operation will be explained only to the extent necessary to an understanding of the invention. Detailed information regarding this circuit is provided in the 1977 TI publication entitled, "TMS 1976 Capacitive Touch Keyboard Interface Manual."

Briefly, the 1976 chip 58 includes nine capacitive inputs, $C_1-C_9$, of which $C_1-C_5$ are used for touch panel scanning in the present embodiment. These capacitive inputs are internally coupled to internal buffers (not shown). Each input is biased high through a very high resistance to a high input voltage level. The internal buffers are designed to detect negative transitions from an externally generated reference voltage. Each input buffer supplies a set command to its associated internal latch (not shown) when an input voltage at its C input is detected which is different than the reference voltage. The output of those latches is communicated internally to an encoder (not shown) which in turn performs the functions of prioritizing and encoding. Priority is assigned in descending numerical order with input $C_1$ assigned the highest priority and $C_9$ the lowest. The input received having the highest priority is encoded as a 4-bit BCD word and transmitted to an internal multiplexer.

The output function of chip 58 is controlled by the input designated ISR. When ISR is low, the BCD word is transferred to outputs $Y_1-Y_4$. A high level at input ISR unconditionally resets all the internal latches responsive to the C input lines and maintains this reset condition until the ISR input returns to a low level. When all internal latches are reset, the signal provided by the latches is the same as if no keys were pressed. The ISR signal is generated at output $R_8$ of microprocessor 90.

Microprocessor 90 receives the BCD coded 4-bit signal from chip 58, representing the scan output from panel 10 at inputs $K_1$, $K_2$, $K_4$ and $K_8$ which are electrically connected to outputs $Y_1$, $Y_2$, $Y_3$, and $Y_4$, respectively, of chip 58.

The output of capacitor network 74 is coupled to input $C_1$ of chip 58. It will be recalled that the logic circuitry of chip 58 is such that input $C_1$ is the highest priority input of chip 58. Thus, whenever the signal received at $C_1$ indicates a touching of one of the conductive paths 70, this input overrides any inputs to chip 58 which might signify the touching of any pad. Microprocessor 90 is appropriately programmed to respond to a touch input at $C_1$ as if no touch input has been detected.

Figure 7:
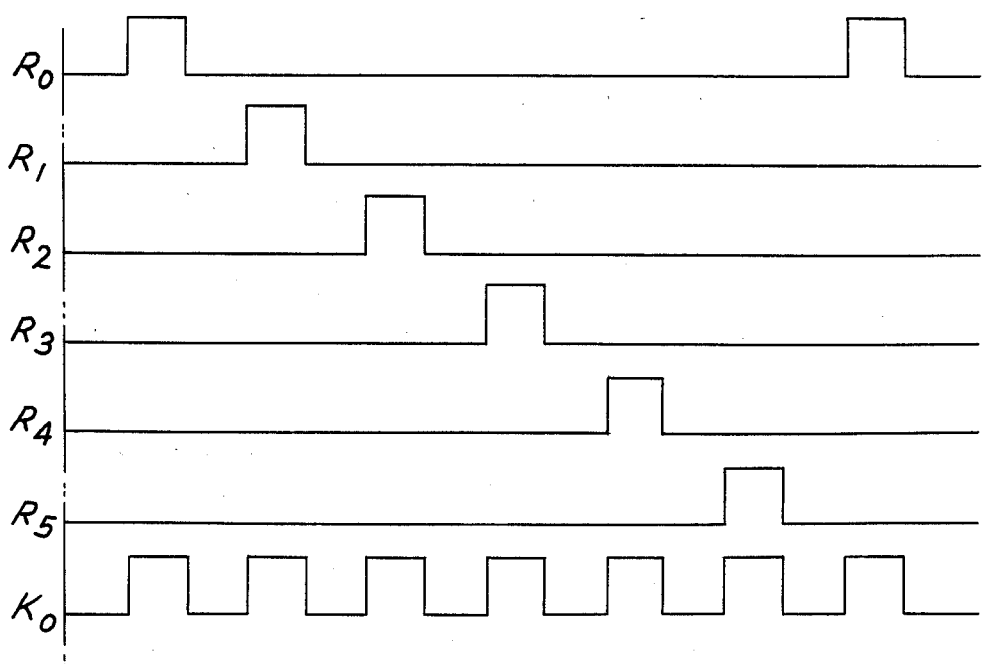
FIG. 7 is a timing diagram illustrating the scan signals employed in the circuit of FIG. 6.

Referring now to FIG. 7, a timing diagram representing one complete scan cycle is shown. During each scan cycle, a scan pulse appears sequentially at each of outputs $R_0-R_5$. An accompanying test pulse appears simultaneously with each scan pulse at output $K_0$. For purposes of illustration, assume touch pad 40A which is in row c and column j is touched. The scan pulses at $R_0-R_4$ are in turn inverted and amplified by driver circuitry 92 and are capacitively coupled via capacitors 52 and switch cells 40 substantially unattenuated to inputs $C_2-C_5$ of detection circuitry 58. Similarly, the test pulse from $K_0$ is coupled essentially unattenuated to input $C_1$ of detection circuitry 58. However, when the scan pulse is generated at $R_5$, an attenuated signal will be detected at input $C_2$ as a result of the touching of touch pad 40A. The BCD coded output at outputs $Y_1-Y_4$ of circuitry 58 for the scan pulse from $R_5$ will identify pad 40A by signifying to microprocessor 90 that the touching of a pad in column j has been detected when scanning row c, and microprocessor 90 will initiate the appropriate programmed response to the touching of pad 40A.

In order to illustrate the preventive function of capacitive network 74, assume the touch panel is touched in the region designated 120 in FIG. 5A. The scan pulses $R_0-R_4$ would, as above, be coupled unattenuated to circuitry 58. However, the scan pulse from $R_5$ would be attenuated at inputs $C_2$, $C_3$ and $C_4$ signifying the touching of the touch pads 40A, 40B and 40C as a result of the touching of conductive paths 56 coupled to each of these pads. The test pulse at $C_1$ from $K_0$ would also be attenuated as a result of the touching of a portion of conductive paths 70. Since the internal logic of circuitry 58 gives highest priority to the input at $C_1$, the resulting BCD coded output at $Y_1-Y_4$ signifies to microprocessor 90 that conductive path 70 has been touched. Microprocessor 90 may be programmed to ignore such inputs, or alternatively to generate a display signal indicating to the user that an improper input has been received.

Figure 3B:
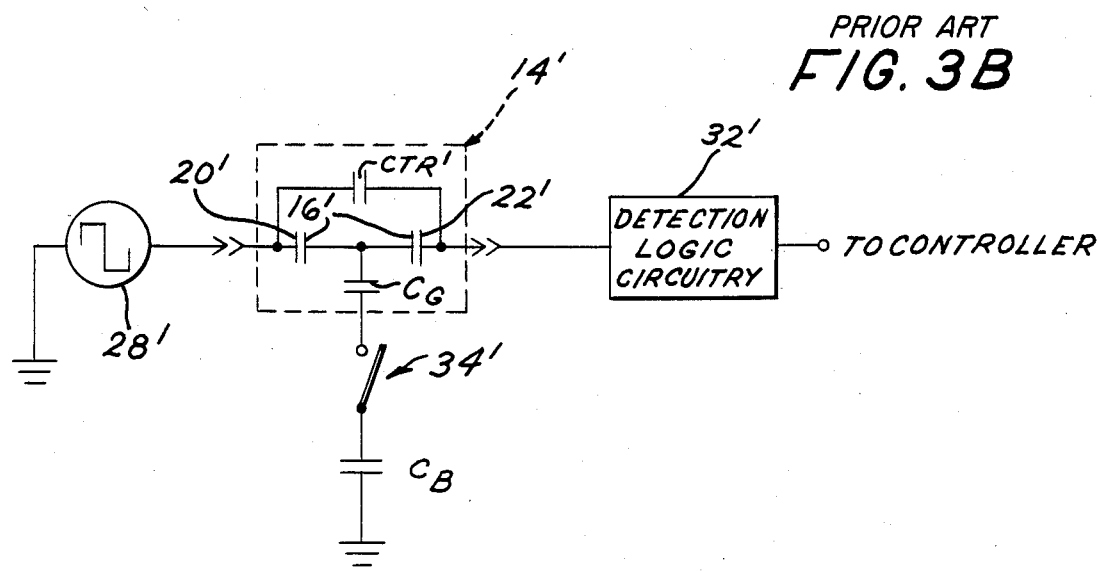
FIG. 3B is a schematic circuit diagram representing the equivalent circuit for the touch switch cell of FIG. 3A.
Figure 8A:
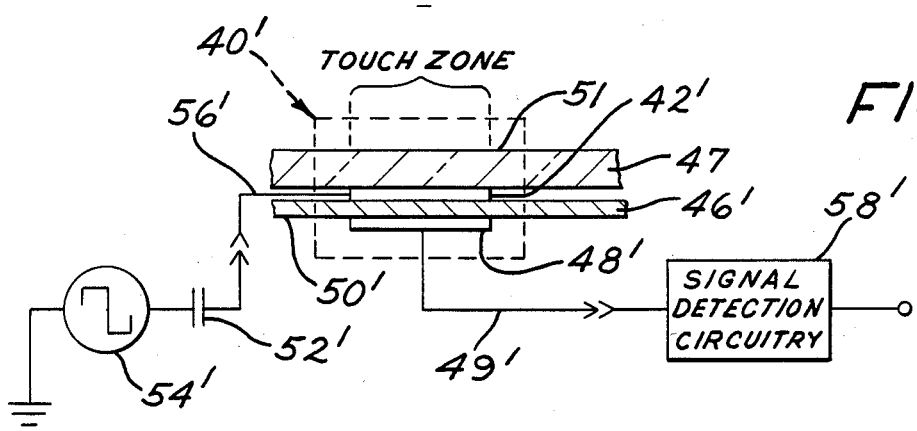
FIG. 8A is a sectional view of another embodiment of a capacitive touch switch arrangement in accordance with the invention.
Figure 8B:
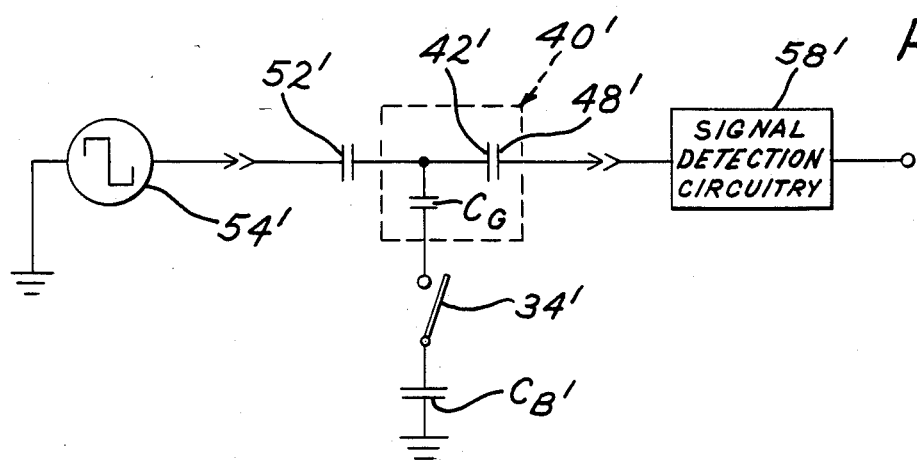
FIG. 8B is a schematic circuit diagram representing the equivalent circuit for the touch switch cell arrangement of FIG. 8A.

An alternative touch cell embodiment in accordance with the invention for a touch panel arrangement of the general type incorporating an additional outer dielectric panel as described with reference to FIGS. 3A and 3B is illustrated in FIG. 8A. Structurally, this arrangement is similar to that of FIG. 5A differing in that an outer panel 47 of glass or other dielectric material overlays dielectric substrate 46' which carries the touch pad 42' and receiving electrode 48', which function together with signal generator 54' and signal detection circuitry 58' in the same manner as their counterparts of the same numerical designation described with reference to FIGS. 4A and 4B. In addition, outer panel 47 would have touch zones 51 defined thereon in registration with the underlying touch electrode such that a human touch of the touch zone would be sufficiently proximate to the underlying touch electrode to provide the desired coupling altering effect. Such areas could be defined by appropriate appearance patterns formed on either the inner or outer surface of panel 47 by conventional techniques.

Figure 9:
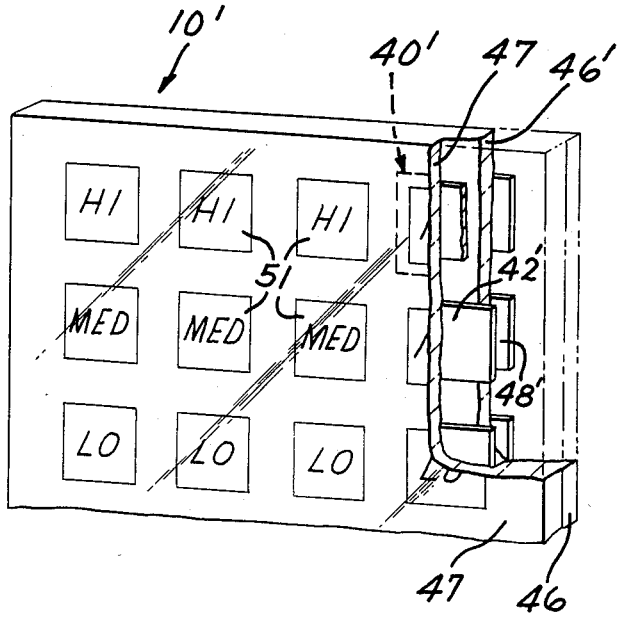
FIG. 9 is a partial perspective view of an alternate capacitive touch control panel for a kitchen appliance incorporating an illustrative embodiment of the switch arrangement of the invention.

A control panel 10' incorporating an array of touch cells 40' of the type illustrated in FIG. 8A is illustrated in FIG. 9. Panel 10' is similar to that of FIGS. 5A and 5B except that the thickness of dielectric substrate 46' is reduced.

Since the touch responsive pads 42' and conductive paths 56' would be beneath panel 47 and thus not exposed to cleaning and scouring, the circuitry could be fabricated using silver epoxy deposition or other relatively inexpensive techniques, rather than the passivated tin oxide used for the exposed surface of the embodiment of FIGS. 5A and 5B.

The associated control circuitry for a panel having a separate glass outer panel could be simplified since the insulative effect of the glass outer panel would prevent the user from initiating a switching action by touching one of the conductive paths connecting the touch pads. Thus, the conductive paths 70 could be simply coupled to the system ground to provide shielding for the conductive traces 56', or they could be eliminated altogether.

It will be apparent from the foregoing that the present invention provides an improved capacitive attenuator type touch switch arrangement which makes possible a savings in panel area over conventional capacitive touch arrangements while being compatible with conventional interface circuitry.

While specific embodiments of the invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. A capacitive touch switch arrangement comprising:
    means for generating a scan signal;
    a substrate of dielectric material having first and second opposed surfaces;
    a touch electrode formed on said first surface for human touching;
    a receiver electrode formed on said second surface in an area overlying and bounded by the area of said touch electrode;
    a capacitive element separate from said touch electrode and said receiver electrode for coupling the scan signal from said signal generating means to said touch electrode;
    said touch electrode cooperating with said receiver electrode to capacitively couple said scan signal from said touch electrode to said receiver electrode, said capacitive coupling being alterable by the human touching of said touch electrode, such that the human touching of said touch electrode changes the signal at said receiver electrode; and
    signal detection means coupled to said receiver electrode and operative to detect changes in the signal at said receiver electrode caused by human touching of said touch electrode.

2. A capacitive touch switch arrangement comprising:
    a scan signal generating means;
    a substrate of dielectric material having first and second opposed surfaces;
    a first electrode formed on said first surface responsive to human touching proximate thereto;
    a second electrode formed on said second surface to enable the capacitive coupling of the signal from said first electrode to said second electrode, said capacitive coupling being altered by human touching proximate said touch electrode;
    a capacitive element separate from said first and second electrode for coupling the scan signal from said signal generating means to said first electrode;
    a conductive path formed on said first surface for electrically connecting said capacitive element to said first electrode;
    input signal detection means coupled to said second electrode and operative to detect the alteration of said capacitive coupling resulting from said proximate human touching.

3. A capacitive touch switch arrangement in accordance with claim 2 further comprising an outer dielectric panel overlying said dielectric substrate having an inner surface facing said first surface and on opposite outer surface;
    said panel having defined thereon a touch zone in register with said first electrode such that human touching of said outer surface in said touch zone alters said capacitive coupling.

4. A capacitive touch switch arrangement in accordance with claim 3 wherein said capacitive element comprises a discrete capacitor device having a pair of terminals, one of said terminals being coupled to said scan signal generating means, the other of said terminals being coupled to said conductive path.

5. A capacitive touch switch arrangement comprising:
    a substrate of dielectric material having first and second opposed surfaces;
    a touch pad formed on said first surface for human touching;
    a receiver electrode formed on said second surface in an area overlying and bounded by the area of said touch pad for capacitive coupling through said substrate with said touch pad;
    a capacitor separate from said touch pad and said receiver electrode;
    a first conductive path formed on said first surface electrically coupling said capacitor to said touch pad;
    circuitry for operating said touch pad and said receiver electrode as a capacitive attenuator switch by applying a scan signal to said touch pad via said capacitor and sensing the resultant signal capacitively coupled from said touch pad to said receiver electrode to detect a decrease in the coupled signal when said touch pad is touched.

6. A capacitive touch switch arrangement in accordance with claim 5 further comprising: a capacitive network comprising a pair of capacitors serially connected between an input terminal and an output terminal; a second conductive path formed on said first surface of said substrate substantially adjacent to said first conductive path such that human touching of said first path would ordinarily also result in touching the said second path, said second path being electrically coupled at one end thereof to the junction of said pair of capacitors and the other end thereof being unconnected; said operating circuitry for applying a test signal at said input terminal simultaneously with the application of the scan signal and sensing the signal capacitively coupled to said output terminal to detect a change in said signal when said second conductive path is touched, the simultaneous detection of a decrease in the signal at said receiver electrode and the signal at the output terminal signifying an erroneous input.

7. A touch switch arrangement comprising:
   a dielectric substrate having first and second opposed surfaces;
   a touch pad formed on said first surface;
   a receiver electrode formed on said second surface opposite said touch pad to enable capacitive coupling therebetween, said capacitive coupling being alterable by the presence or absence of the human touching of said touch pad;
   a scan signal generator for applying a pulsating scan signal to said touch pad, which signal is capacitively coupled from said touch pad to said receiver electrode thereby providing a first output signal at said receiving electrode;
   a transmitting capacitor having an input connected to receive the scan signal from said signal generator and an output connected to capacitively couple the scan signal to said touch pad;
   a first conductive path formed on said first surface connecting the output of said transmitter capacitor to said touch pad for coupling said scan signal from said transmitting capacitor to said touch pad;
   a second conductive path formed generally adjacent said first path such that the human touching of said first path would ordinarily result in the simultaneous touching of said second path;
   a capacitive network having an input and an output, said input being connected to said scan signal generating means said network further comprising circuitry for capacitively coupling the scan signal from said network input to said network output thereby providing a second output signal at said network output;
   said second conductive path being coupled to said capacitive network such that said capacitive coupling between said input and output of said capacitive network is alterable by the presence or absence of the human touching of said second conductive path;
   signal detection circuitry having a first input connected to receive said first output signal and having a second input connected to receive said second output signal, said signal detection circuitry being operative to detect decreases in said first and second output signals indicative of a human touch and to generate a control signal to initiate a switching action upon detection of a decrease in said first output along and to generate a control signal to inhibit the initiation of a switching action upon detection of a decrease in said second output regardless of the state of said first output whereby initiation of a switching action resulting from the touching of said conductive paths is prevented.

8. A capacitive touch control panel arrangement comprising:
   a substrate of dielectric material having first and second opposed surfaces;
   a plurality of touch pads fabricated on said first surface;
   a plurality of receiver pads fabricated on said second surface, each being arranged for capacitive coupling through said substrate with a corresponding one of said touch pads;
   a plurality of transmitting capacitors, each associated with one of said touch pads;
   a first plurality of conductive paths formed along said first surface electrically connecting one of said transmitting capacitors to its associated touch pad;
   a capacitive network comprising a pair of capacitive elements serially connected between an input terminal and an output terminal;
   a plurality of second conductive paths formed on said first surface, each extending closely adjacent an associated one of said first paths such that touching of one of said first conductive paths ordinarily results in the touching of its adjacent second conductive path; each of said plurality of second paths being commonly connected to the junction of said pair of serially connected capacitive elements; and
   circuitry for operating said plurality of touch pads and said plurality of receiver pads together as an array of capacitive attenuator touch switches by applying a scan signal to each of said transmitter capacitors, which signal is coupled by each of said transmitter capacitors to its associated touch pad; and sensing the resultant signal capacitively coupled to said associated receiver pad to detect a decrease in the coupled signal when said touch pad is touched;
   said circuitry further operating to avoid erroneous signal inputs resulting from inadvertent touching of one or more of said first conductive paths by applying said scan signal to the input of said capacitive network and sensing the resultant signal at the output of said capacitive network to detect a decrease in the coupled signal when one of said second conductive paths is touched, detection of a simultaneous decrease in the signal at the capacitor network output and the receiver pad signifying an erroneous input.

9. A capacitive touch control panel arrangement comprising:
   a substrate of dielectric material having first and second opposed surfaces;
   a plurality of touch pads fabricated on said first surface;
   a plurality of receiver pads fabricated on said second surface, each being arranged for capacitive coupling through said substrate with a corresponding one of said touch pads;
   transmitting capacitor means for coupling a scan signal to each of said touch pads;

a first plurality of conductive paths formed along said first surface electrically connecting said capacitor means to said touch pads;

a capacitive network comprising a pair of capacitive elements serially connected between an input terminal and an output terminal;

a plurality of second conductive paths formed on said first surface, each extending closely adjacent an associated one of said first paths such that touching of one of said first conductive paths ordinarily results in the touching of its adjacent second conductive path; each of said plurality of second paths being commonly connected to the junction of said pair of serially connected capacitive elements; and circuitry for operating said plurality of touch pads and said plurality of receiver pads together as an array of capacitive attenuator touch switches by applying said scan signal to said transmitter capacitor means, which signal is coupled by said transmitter capacitor means to each of said touch pads, and sensing the resultant signal capacitively coupled to said associated receiver pad to detect a decrease in the coupled signal when a touch pad is touched;

said circuitry further operating to avoid erroneous signal inputs resulting from inadvertent touching of one or more of said first conductive paths by applying said scan signal to the input of said capacitive network and sensing the resultant signal at the output of said capacitive network to detect a decrease in the coupled signal when one of said second conductive paths is touched, detection of a simultaneous decrease in the signal at the capacitor network output and the receiver pad signifying an erroneous input.

10. A multiplexed capacitive touch control panel arrangement comprising:

a substrate of dielectric material having first and second opposed surfaces;

a plurality of touch responsive electrodes fabricated along said first surface;

a plurality of receiver electrodes fabricated along said second surface, each being arranged for capacitive coupling through said substrate with a corresponding one of said touch responsive electrodes;

a plurality of discrete transmitting capacitors formed independently of said touch responsive electrodes and said receiver electrodes, each of said transmitting capacitors being associated with one of said touch responsive electrodes;

a first plurality of conductive paths fabricated on said first surface electrically connecting each of said capacitive elements to its associated touch responsive electrode;

an outer dielectric panel overlying said first surface of said substrate having an inner surface facing said substrate and an opposed outer surface, said panel having defined thereon touch zones, each zone being in register with corresponding ones of said touch electrodes such that human touching of one of said touch zones alters the capacitive coupling between the corresponding touch electrode and receiver electrode;

circuitry for operating said plurality of touch zones, touch electrodes and receiver electrodes together as an array of capacitive attenuater touch switches by applying a scan signal to each of said transmitter capacitors and sensing the resultant signal capacitively coupled to its associated receiver electrode to detect a change in the coupled signal when said touch zone is touched.

* * * * *

UNITED STATES PATENT AND TRADEMARK OFFICE
CERTIFICATE OF CORRECTION

PATENT NO.   : 4,561,002
DATED        : December 24, 1985
INVENTOR(S)  : Norman H. Chiu It is certified that error appears in the above-identified patent and that said Letters Patent is hereby corrected as shown below:

Column 12, line 22, before "signal" insert --scan--.

Column 13, line 16, after "circuitry" insert --including means--.

Column 14, line 3, "along" should read --alone--.

Signed and Sealed this

Eighteenth Day of March 1986

[SEAL]

Attest:

DONALD J. QUIGG

Attesting Officer

Commissioner of Patents and Trademarks